US007564254B2

(12) United States Patent
Chun

(10) Patent No.: US 7,564,254 B2
(45) Date of Patent: Jul. 21, 2009

(54) SEMICONDUCTOR DEVICE AND TEST METHOD THEREOF

(75) Inventor: Jun-Hyun Chun, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 3 days.

(21) Appl. No.: 11/647,147

(22) Filed: Dec. 29, 2006

(65) Prior Publication Data

US 2008/0088333 A1  Apr. 17, 2008

(30) Foreign Application Priority Data

Aug. 31, 2006   (KR)   ...................... 10-2006-0083532

(51) Int. Cl.
G01R 31/02      (2006.01)
G01R 31/28      (2006.01)
G01R 31/26      (2006.01)
(52) U.S. Cl. ........................ 324/763; 324/73.1; 324/765
(58) Field of Classification Search .................. 324/73, 324/763, 765
See application file for complete search history.

(56) References Cited

U.S. PATENT DOCUMENTS

| 4,243,937 | A  | * | 1/1981  | Multani et al. ............... 324/765 |
| 4,743,843 | A  | * | 5/1988  | Tada ........................... 324/114 |
| 4,778,771 | A  | * | 10/1988 | Hiki ............................... 438/6 |
| 5,206,582 | A  |   | 4/1993  | Ekstedt et al. |
| 5,485,095 | A  |   | 1/1996  | Bertsch et al. |
| 5,640,101 | A  |   | 6/1997  | Kuji et al. |
| 5,818,249 | A  |   | 10/1998 | Momohara |
| 6,000,843 | A  | * | 12/1999 | Sawada ...................... 714/721 |
| 6,087,840 | A  |   | 7/2000  | Mizuta |
| 6,239,603 | B1 | * | 5/2001  | Ukei et al. .................. 324/763 |
| 6,362,641 | B2 |   | 3/2002  | Shida |
| 6,707,064 | B2 |   | 3/2004  | Jang et al. |
| 6,844,751 | B2 |   | 1/2005  | Marshall et al. |
| 6,925,404 | B2 | * | 8/2005  | Corr ........................... 702/117 |
| 7,005,875 | B1 | * | 2/2006  | Natarajan et al. ........... 324/765 |
| 7,307,441 | B2 | * | 12/2007 | Sohn et al. .................. 324/765 |

FOREIGN PATENT DOCUMENTS

KR     1999-0051367     7/1999

* cited by examiner

Primary Examiner—Jermele M Hollington
(74) Attorney, Agent, or Firm—Mannava & Kang, P.C.

(57) ABSTRACT

A semiconductor device includes: a command control circuit for decoding a command signal to output a test signal and a normal control signal; a normal circuit for performing a predetermined operation in response to the normal control signal; and a test circuit for testing electrical characteristics of unit elements provided in the normal circuit in response to the test signal.

13 Claims, 7 Drawing Sheets

FIG. 8

| TM | CNT | | | | TM code |
|---|---|---|---|---|---|
|  | <3> | <2> | <1> | <0> |  |
| 0 | 0 | 0 | 0 | 0 | NORMAL |
| 1 | 0 | 0 | 0 | 1 | TMC<1> |
| 2 | 0 | 0 | 1 | 0 | TMC<2> |
| 3 | 0 | 0 | 1 | 1 | TMC<3> |
| 4 | 0 | 1 | 0 | 0 | TMC<4> |
| 5 | 0 | 1 | 0 | 1 | TMC<5> |
| 6 | 0 | 1 | 1 | 0 | TMC<6> |
| 7 | 0 | 1 | 1 | 1 | TMC<7> |
| 8 | 1 | 0 | 0 | 0 | TMC<8> |
| 9 | 1 | 0 | 0 | 1 | TMC<9> |
| 10 | 1 | 0 | 1 | 0 | TMC<10> |
| 11 | 1 | 0 | 1 | 1 | TMC<11> |
| 12 | 1 | 1 | 0 | 0 | TMC<12> |
| 13 | 1 | 1 | 0 | 1 | TMC<13> |
| 14 | 1 | 1 | 1 | 0 | TMC<14> |
| 15 | 1 | 1 | 1 | 1 | TMC<15> |

SEMICONDUCTOR DEVICE AND TEST METHOD THEREOF

FIELD OF THE INVENTION

The present invention relates to a semiconductor device, and more particularly, to a test circuit for testing a semiconductor device.

DESCRIPTION OF RELATED ART

Generally, semiconductor devices are formed on silicon wafers. Several tens to several hundreds of semiconductor devices are formed on one wafer. The semiconductor devices are tested for normal operation, and only normal semiconductor devices are packaged and put into the market.

The semiconductor devices are tested at the wafer level in various methods. An electrical parameter test method is to test unit elements of the semiconductor device for the designed electric characteristics. A function test method is to test for the semiconductor device operation as designed. This method tests if an output signal of the semiconductor device is normal with respect to an input signal.

In order to test the electrical parameters, a constant voltage is applied to MOS transistors and resistors, which are unit elements of the semiconductor device, and currents flowing through them are measured. However, it is almost impossible to apply a constant voltage to the MOS transistors and the resistors arranged in various circuits. To solve this problem, elements such as MOS transistors and resistors are formed in test patterns, a voltage is applied to the test patterns, and currents flowing through the test patterns are measured. Then, the electrical parameters of the MOS transistor and the resistors formed in the actual semiconductor device are estimated. The test patterns are formed in regions that are defined between regions where the semiconductor devices are formed.

FIG. 1 is a flowchart of a method for manufacturing a semiconductor device.

Designed semiconductor devices are manufactured on a wafer in step S1. In step S2, electrical parameters of the manufactured semiconductor devices are monitored. This monitoring operation aims to inspect if MOS transistors and resistors formed in the semiconductor devices have the desired electrical characteristics. In step S3, the functions of the semiconductor devices are tested at the wafer level in order to determine if the semiconductor devices operate normally. In step S4, only normal semiconductor devices are packaged. In step S5, the packaged semiconductor devices are tested. In step S6, the semiconductor devices passing the package test are put into the market.

FIG. 2 is a plan view of a wafer on which the semiconductor devices are manufactured.

Several tens to several hundreds of semiconductor devices are manufactured on a single wafer 10. A test circuit 20 is arranged between regions where the semiconductor devices are manufactured. The test circuit 20 uses test patterns for testing if unit elements of the semiconductor devices, such as MOS transistors and resistors, have the same electrical characteristics as designed. The test patterns are not arranged to correspond to all semiconductor devices manufactured at the wafer level. The reason for this is that a space between the semiconductor devices is insufficient.

The semiconductor devices are manufactured using a photo process, an etching process, and a deposition process. When these processes are finished, one layer among multiple layers of the semiconductor device is formed. In order to form a next layer, the photo process, the etching process and the deposition process are again performed. The photo process is not separately performed on the semiconductor devices, but it is performed on as many semiconductor devices as the number of photo shots supported by one photo equipment. For example, if one-time photo shot corresponds to four semiconductor devices, the same layers of four semiconductor devices can be formed by the photo process. Since the regions formed by one-time photo process have the same characteristics, test patterns are arranged one by one in the regions where one-time photo process is possible.

FIG. 3 is a circuit diagram of the test circuit 20 of FIG. 2.

The test circuit 20 includes a plurality of MOS transistors M1 to M6 and resistors RG and RM arranged in parallel. The MOS transistors M1 to M6 have different channel lengths and widths in order to test the channel lengths and widths of all MOS transistors. The resistor RG is a test pattern for measuring a gate resistance of the MOS transistor, and the resistor RM is a test pattern for measuring a line resistance.

Each of the MOS transistors M1 to M6 has one terminal connected to a ground pad VSS PAD, and a gate commonly connected to a gate voltage pad VG PAD. The MOS transistors M1 to M6 have the other terminals connected to test pads VD1 PAD to VD8 PAD receiving corresponding test voltages, respectively. A method for testing the MOS transistors M1 to M6 includes the steps of: applying a gate voltage to their gates; applying corresponding test voltages to first terminals of the MOS transistors M1 to M6; and measuring currents flowing through the common pad VSS PAD. Whether the MOS transistors M1 to M6 are normally manufactured can be verified by checking the currents. Also, the resistors RG and RM can be tested by measuring currents corresponding to a voltage difference across the resistors RG and RM.

When the semiconductor devices pass the test for the test circuit, it can be concluded that the semiconductor devices formed on the wafer are manufactured as designed. However, if the basic electrical characteristics of the semiconductor devices are analogized using one test pattern, there can occur error in the electrical characteristics of the actual semiconductor devices. As the technology is developed, the semiconductor devices are highly integrated, the circuit area occupied by one semiconductor device is reduced. Thus, the number of semiconductor devices to be analogized using the test patterns increases. Therefore, the electrical characteristics of the test patterns become increasingly different from those of unit elements of the actual semiconductor devices.

SUMMARY OF THE INVENTION

It is, therefore, an object of the present invention to provide a test circuit that can test the electrical characteristics of the semiconductor device more correctly.

In accordance with an aspect of the present invention, there is provided a semiconductor device including: a command control circuit for decoding a command signal to output a test signal and a normal control signal; a normal circuit for performing a predetermined operation in response to the normal control signal; and a test circuit for testing electrical characteristics of unit elements provided in the normal circuit in response to the test signal.

In accordance with another aspect of the present invention, there is provided a semiconductor device including: a normal circuit; a test signal generator circuit for counting a clock signal to output a plurality of test signals; and a plurality of unit testers enabled in response to the test signals to test electrical characteristics of unit elements provided in the normal circuit.

In accordance with a further aspect of the present invention, there is provided a test method of a semiconductor device having a normal circuit and a test circuit having a plurality of unit testers for testing electrical characteristics of unit elements provided in the normal circuit, the test method includes: generating a test clock signal; generating a plurality of test signals using the test clock signal; and operating a corresponding one of the unit testers in response to a corresponding one of the test signals.

In accordance with the present invention, the test circuit for testing the electrical parameters of the semiconductor device is provided within the semiconductor device. Thus, in testing the functions of the semiconductor device, electrical characteristics of unit elements of the semiconductor device can be tested at the same time.

BRIEF DESCRIPTION OF THE DRAWINGS

The above and other objects and features of the present invention will become apparent from the following description of the preferred embodiments given in conjunction with the accompanying drawings, in which:

FIG. 8 is a diagram illustrating an operation of the test signal generator of FIG. 5.

DETAILED DESCRIPTION OF THE INVENTION

A semiconductor device in accordance with exemplary embodiments of the present invention will be described in detail with reference to the accompanying drawings.

Figure 1:
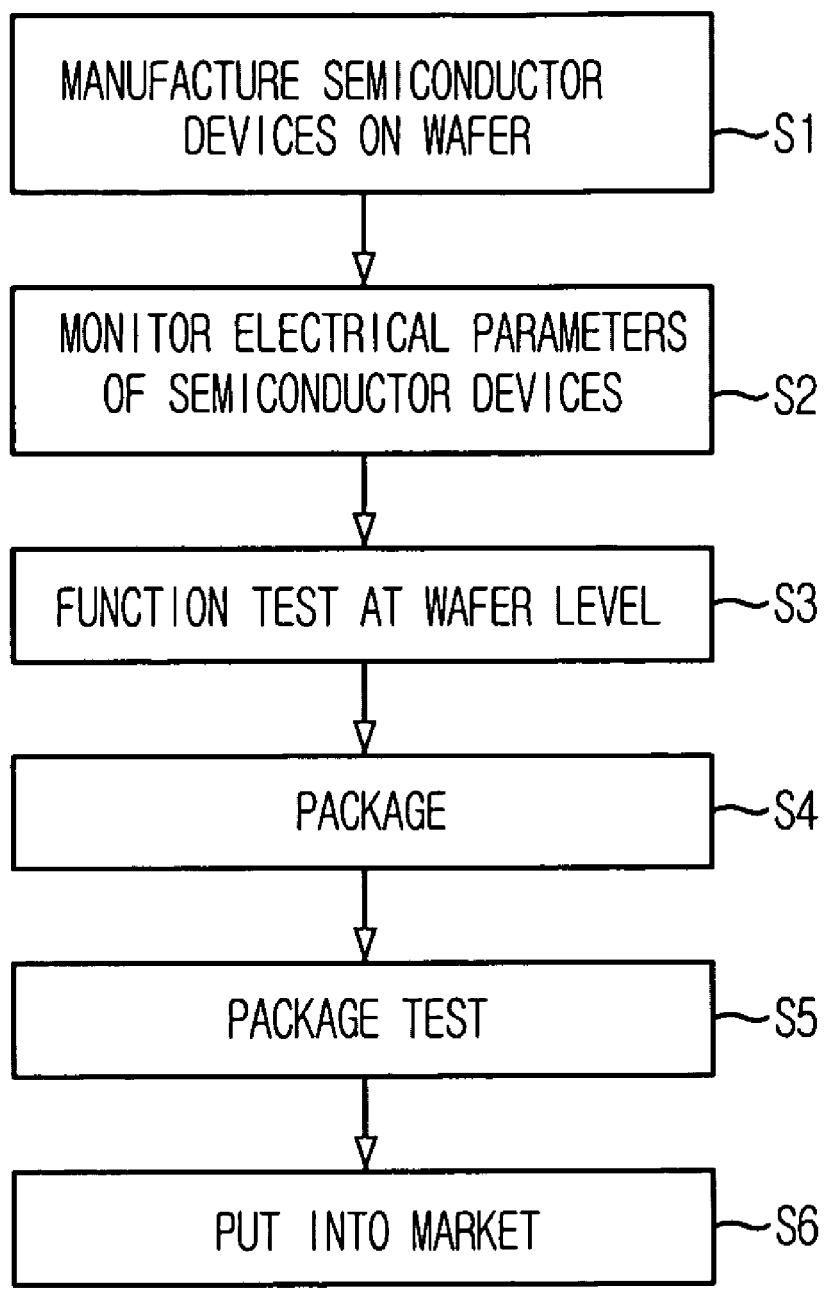
FIG. 1 is a flowchart illustrating a known method for manufacturing a semiconductor device.
Figure 2:
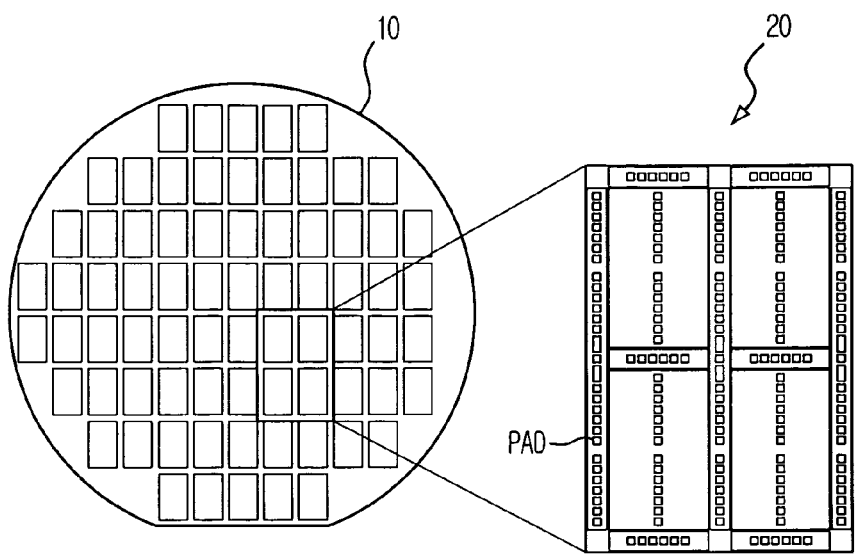
FIG. 2 is a plan view of a wafer.
Figure 3:
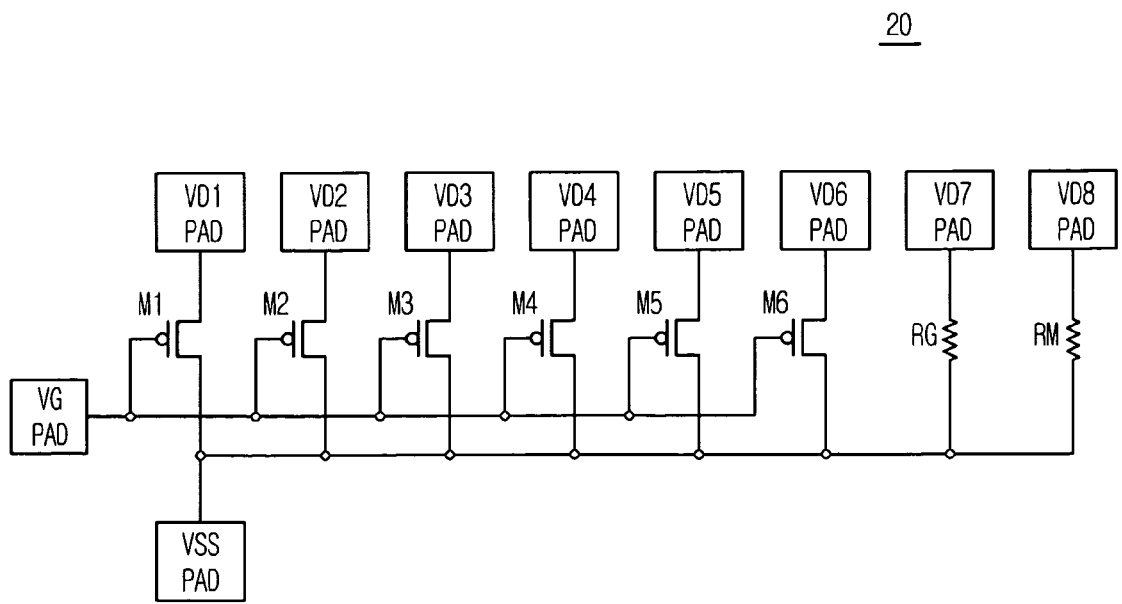
FIG. 3 is a circuit diagram of a test circuit of FIG. 2.
Figure 4:
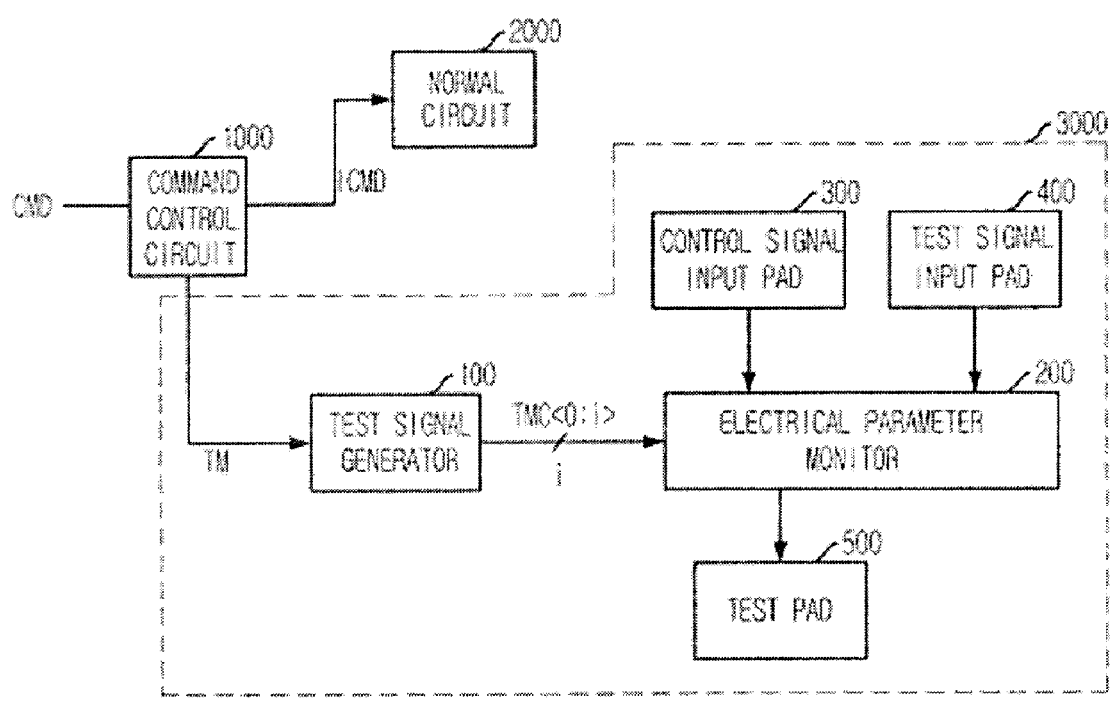
FIG. 4 is a block diagram of a semiconductor device in accordance with an embodiment of the present invention.

FIG. 4 is a block diagram of a semiconductor device in accordance with an embodiment of the present invention.

The semiconductor device includes a command control circuit 1000, a normal circuit 2000, and a test circuit 3000. The command control circuit 1000 decodes an external command CMD to output a test signal TM and a normal control signal ICMD. The normal circuit 2000 performs a predetermined operation in response to the normal control signal ICMD. The test circuit 3000 tests electrical characteristics of unit elements of the normal circuit 2000 in response to the test signal TM.

The normal circuit 2000 represents all circuits for performing operations of the semiconductor device. The test circuit 3000 performs a test operation using test patterns in response to the test signal TM that is constantly clocked.

The test circuit for testing the electrical parameters is included within the semiconductor device. Thus, in testing the functions of the semiconductor device, electrical characteristics of unit elements of the normal circuit 2000, such as MOS transistors and resistors, can also be tested.

More specifically, the test circuit 3000 includes a test signal generator 100 and an electrical parameter monitor 200. The test signal generator 100 counts the test signal TM to output a plurality of test control signals TMC<1:i>. The electrical parameter monitor 200 includes a plurality of unit testers for testing electrical characteristics of unit elements of the normal circuit 2000 in response to the test control signals TMC<0:i>.

The test circuit 3000 further includes a control signal input pad 300, a common test signal input pad 400, and a common test pad 500. The control signal input pad 300 is configured to receive a control signal for controlling and enabling of the unit testers. The common test signal input pad 400 is configured to provide test input signals to the unit testers of the electrical parameter monitor 200. The common test pad 500 is configured to receive test output signals from the unit testers.

Figure 5:
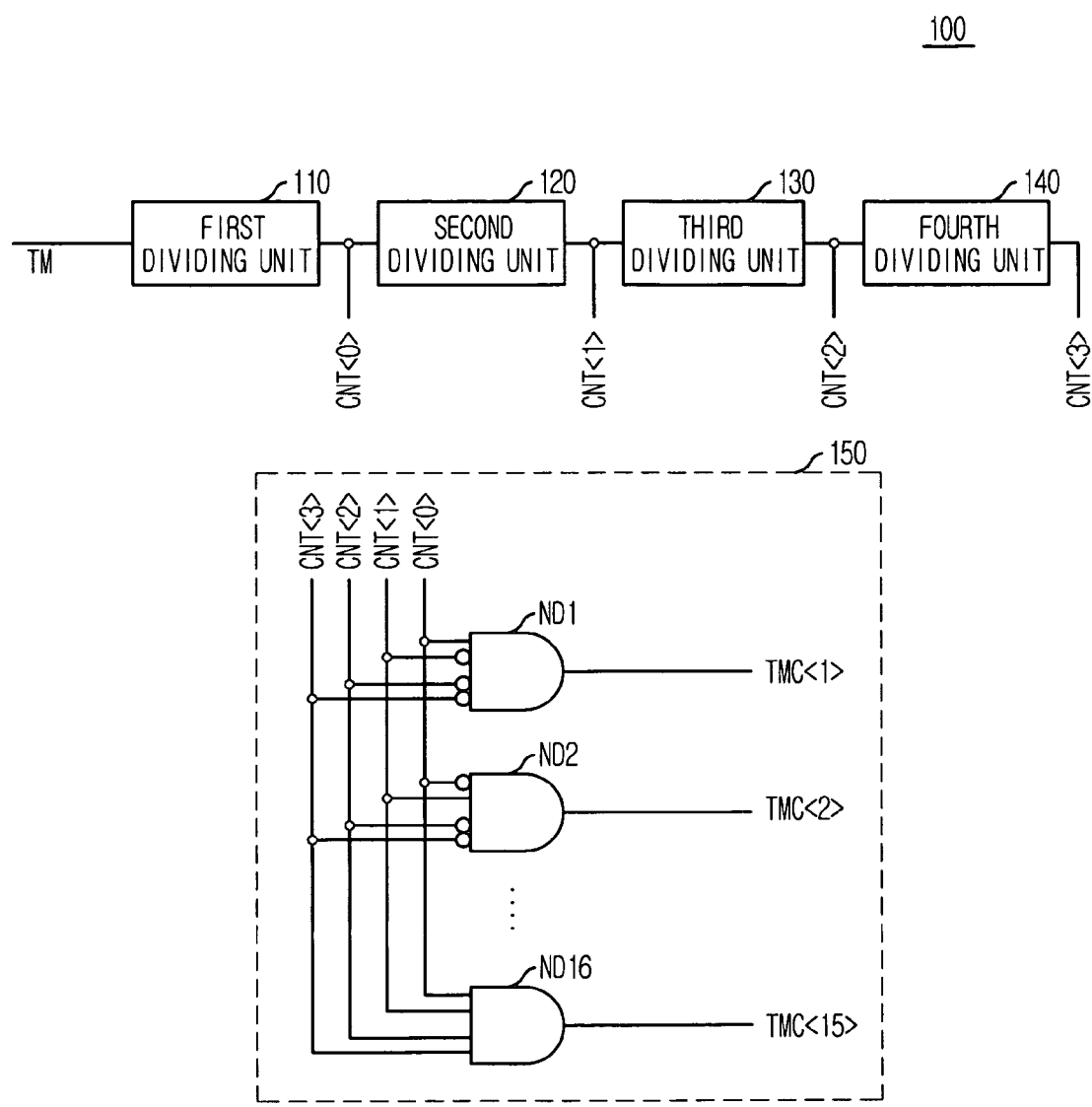
FIG. 5 is a block diagram of a test signal generator of FIG. 4.

FIG. 5 is a block diagram of the test signal generator of FIG. 4.

The test signal generator 100 includes a first dividing unit 110 for dividing the test signal TM in a first division ratio, a second dividing unit 120 for dividing an output signal CNT<0> of the first dividing unit 110 in a second division ratio, a third dividing unit 130 for dividing an output signal CNT<1> of the second dividing unit 120 in a third division ratio, a fourth dividing unit 140 for dividing an output signal CNT<2> of the third dividing unit 130 in a fourth division ratio, and a decoding unit 150 for decoding the output signals CNT<0> to CNT<3> of the first to fourth dividing units 110, 120, 130 and 140 to output the test control signals TMC<1> to TMC<15>. The first to fourth division ratios may be equal to or different from one another. The first to fourth division ratios can be appropriately determined according to internal circuits of the decoding unit 150 and the dividing units.

The decoding unit 150 includes a plurality of AND gates ND1 to ND16 for ANDing the output signals CNT<0> to CNT<3> of the first to fourth dividing units 110 to 140. The AND gates ND1 to ND16 are configured to receive signals having a different logic combination.

Figure 6:
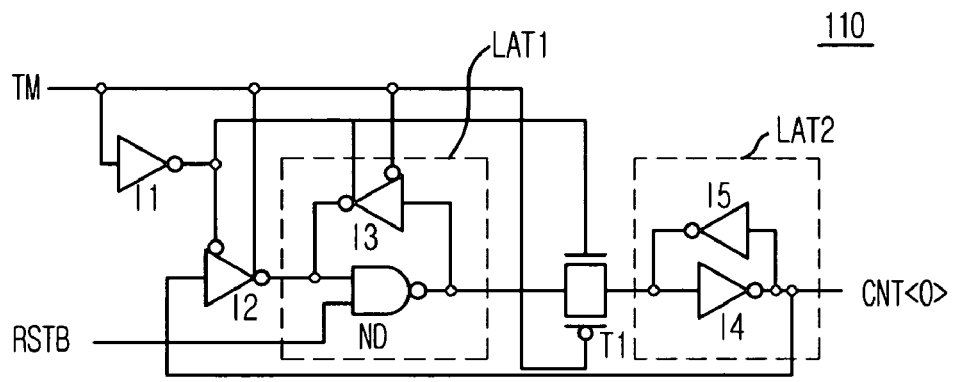
FIG. 6 is a circuit diagram of a dividing unit illustrated in FIG. 5.

FIG. 6 is a circuit diagram of the first dividing unit 110 of FIG. 5. Since the second to fourth dividing units 120, 130 and 140 have the same structure as that of the first dividing unit 110, their detailed description will be omitted.

The first dividing unit 110 includes first and second latches LAT1 and LAT2, a transmission gate T1, a first inverter I1, and a first three-phase inverter I2, and counts the test signal TM to output the divided-by-2 signal CNT<0>. The first latch LAT1 includes a second three-phase inverter I3 and a NAND gate ND, and the second latch LAT2 includes second and third inverters I4 and I5. A reset control signal RSTB is inputted to the NAND gate ND.

Figure 7:
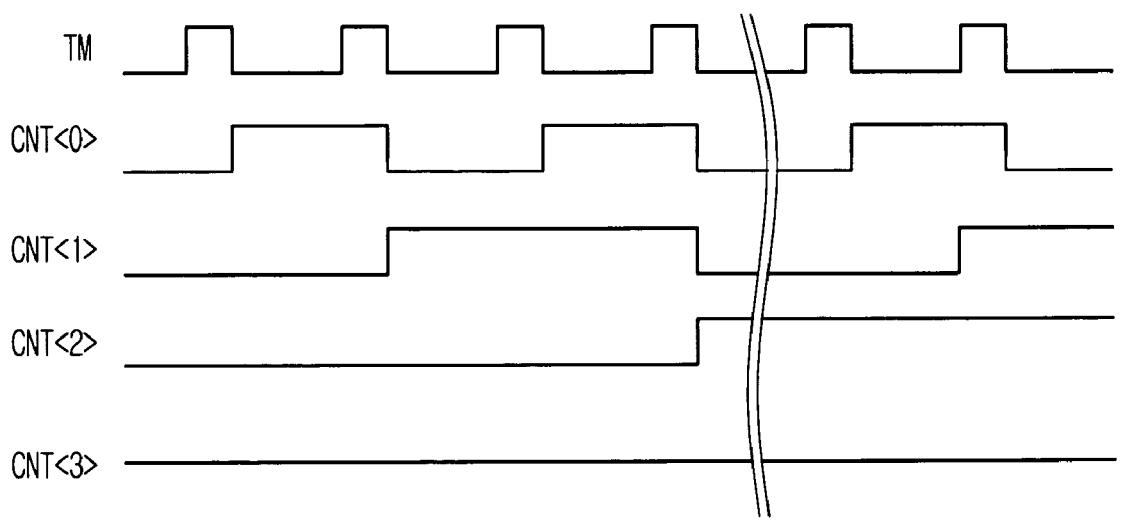
FIG. 7 is a waveform diagram illustrating an operation of the test signal generator of FIG. 5.

FIG. 7 is a waveform diagram illustrating an operation of the test signal generator 100 of FIG. 5.

The first dividing unit 110 of the test signal generator 100 divides the test signal TM by 2 to output the signal CNT<0>. The second dividing unit 120 divides the output signal CNT<0> of the first dividing unit 110 by 2 to output the signal CNT<1>. The third dividing unit 130 divides the output signal CNT<1> of the second dividing unit 120 by 2 to output the signal CNT<2>. The fourth dividing unit 140 divides the output signal CNT<2> of the third dividing unit 130 by 2 to output the signal CNT<3>. The decoding unit 150 selectively outputs 16 decoding test control signals TMC<1:15> using the output signals CNT<0> to CNT<4> of the dividing units 110 to 140.

FIG. 8 is a diagram illustrating an operation of the test signal generator 100 of FIG. 5.

The states in which the decoder 150 outputs the 16 decoded test control signals TMC<1:15> using the output signals CNT<0> to CNT<3> of the dividing units 110 to 140 can be seen from FIG. 8. As illustrated in FIG. 7, the test control signals TMC<1:15> can be efficiently generated using one test signal TM. Also, in testing the function of the semiconductor device, the test circuit 1000 is also operated. Thus, the electrical parameters of the unit elements of the semiconductor device can be tested at the same time.

Figure 9:
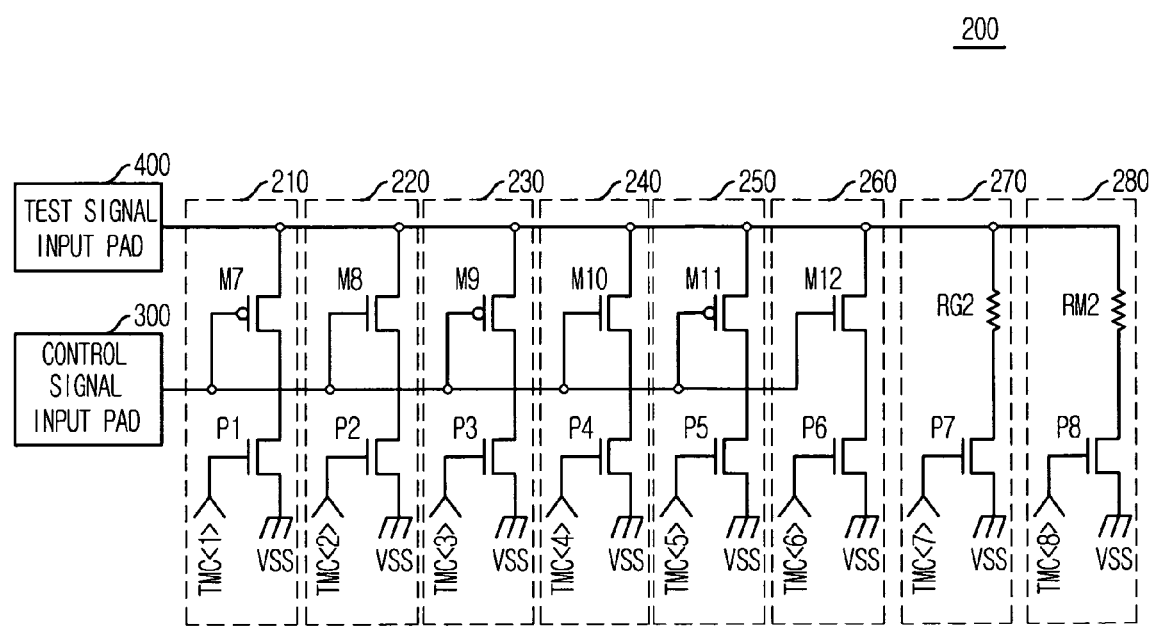
FIG. 9 is a circuit diagram of an electrical parameter monitor of FIG. 4.

FIG. 9 is a circuit diagram of the electrical parameter monitor of FIG. 4.

The electrical parameter monitor 200 includes a plurality of unit testers 210 to 280. Each of the unit testers 210 to 280 includes the same types of unit elements as those of the normal circuit 2000, such as MOS transistors and resistors.

For example, the first unit tester 210 includes a first test MOS transistor M7 and a first switching MOS transistor P1. The first test MOS transistor M7 has one terminal receiving the test input signal through the test signal input pad 400, and a gate receiving the control signal through the control signal input pad 300. The first switching PMOS transistor P1 has one terminal connected to the other terminal of the first test MOS transistor M7, a gate receiving the test control signal, and the other terminal connected to Vss. The control signal input through the control signal input pad 300 is a signal to provide a voltage for turning on the first test MOS transistor M7. A channel length and width of the first test MOS transistor M7 in the first unit tester 210 are equal to those of a MOS transistor of the normal circuit.

The control signal input through the control signal input pad 300 may be provided by a separate circuit. Also, a reference signal used in an input circuit receiving an input signal during a normal operation may be used as the control signal. In order to receive the signal at a high speed, the input circuit is configured to receive differential signals. One of the differential signals is an external signal, and the other is an internal reference signal. In this case, the reference signal may be used as a signal that is provided to the control signal input pad.

A seventh unit tester 270 includes a test resistor RG2 and a seventh switching MOS transistor P7. The test resistor RG2 has one terminal receiving the test input signal through the test signal input pad 400. The seventh switching MOS transistor P7 has one terminal connected to the other terminal of the test resistor RG2, a gate receiving the test control signal, and the other terminal connected to the test pad 500. The test resistor RG2 is designed to have the same resistance as that of the resistor of the normal circuit 2000.

As described above, the unit testers of the electrical parameter monitor 200 correspond to various kinds of MOS transistors and resistors of the normal circuit 2000, and are designed to be equal to the unit elements.

In order to test the electrical characteristic of the first test MOS transistor M7, the first test MOS transistor M7 is turned on by inputting the control signal to its gate when the test control signal TMC<1> from the test signal generator 100 becomes a high level. The test voltage is applied through the test signal input pad 400, and an amount of current flowing through the test pad 500 is measured. In this way, it is possible to verify whether the first test MOS transistor M7 is normal. Since the first test MOS transistor M7 is provided within the semiconductor device, it can be determined that all MOS transistors corresponding to the first test MOS transistor M7 operate normally if the MOS transistor M7 operates normally. Like the resistors of the seventh and eighth unit testers 270 and 280 are equally applied.

As described above, since the test circuits are provided within the semiconductor device, the electrical characteristics of the unit elements of the manufactured semiconductor device can be tested more correctly.

Since the test patterns for testing the electrical characteristics of the unit elements of the semiconductor device are provided within the semiconductor device, the electrical characteristics of the unit elements can be tested more correctly. Moreover, in testing the functions of the semiconductor device, the electrical characteristics can also be tested. Thus, the characteristics of the semiconductor device can be tuned according to the electrical characteristics. Consequently, the characteristics of the manufactured semiconductor device can be enhanced.

The present application contains subject matter related to Korean patent application No. 2006-83532, filed in the Korean Intellectual Property Office on Aug. 31, 2006, the entire contents of which are incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A semiconductor device, comprising:
   a command control circuit for decoding a command signal to output a test signal and a normal control signal;
   a normal circuit for performing a predetermined operation in response to the normal control signal; and
   a test circuit for testing electrical characteristics of unit elements provided in the normal circuit in response to the test signal,
   wherein the test circuit includes a test signal generator for counting the test signal to output a plurality of test control signals,
   wherein the test signal generator includes:
   a plurality of dividing units for dividing the test signal in different division ratios; and
   a decoding unit for decoding the output signals of the plurality of dividing units to output the test control signals.

2. The semiconductor device of claim 1, wherein the test circuit further includes:
   a monitor having a plurality of unit testers for testing the electrical characteristics of the unit elements of the normal circuit in response to the test control signals.

3. The semiconductor device of claim 2, wherein the test circuit further comprises:
   a common test signal input pad configured to provide test input signals to the unit testers;
   a common test pad configured to receive test output signals from the unit testers; and
   a control signal input pad configured to input a control signal for controlling an enabling of the unit testers.

4. The semiconductor device of claim 1, wherein the plurality of dividing units includes:
   a first dividing unit for dividing the test signal in a first division ratio; and
   a second dividing unit for dividing an output signal of the first dividing unit in a second division ratio, and
   wherein the decoding unit decodes the output signal of the first dividing unit and the output signal of the second dividing unit to output the test control signals.

5. The semiconductor device of claim 4, wherein the decoding unit includes a logic gate for performing an AND operation to the output signal of the first dividing unit and the output signal of the second dividing unit.

6. The semiconductor device of claim 4, wherein the unit tester includes:
   a test MOS transistor having one terminal receiving the test input signal through the test signal input pad, and a gate receiving the control signal through the control signal input pad; and a switching MOS transistor having one terminal connected to the other terminal of the test MOS transistor, a gate receiving the test control signal, and the other terminal connected to the test pad.

7. The semiconductor device of claim 6, wherein the test MOS transistor has channel length and width equal to that of a MOS transistor provided in the normal circuit.

8. The semiconductor device of claim 4, wherein the unit tester includes:
   a test resistor having one terminal receiving the test input signal through the test signal input pad; and
   a switching MOS transistor having one terminal connected to the other terminal of the test resistor, a gate receiving the test control signal, and the other terminal connected to the test pad.

9. The semiconductor device of claim 8, wherein the test resistor has the same resistance as that of a resistor provided in the normal circuit.

10. A semiconductor device, comprising:
    a normal circuit;
    a test signal generator circuit for counting a clock signal to output a plurality of test signals; and
    a plurality of unit testers enabled in response to the test signals to test electrical characteristics of unit elements provided in the normal circuit,
    wherein the test signal generator includes:
    a plurality of dividing units for dividing the test signal in different division ratios; and
    a decoding unit for decoding the output signals of the plurality of dividing units to output the test control signals.

11. The semiconductor device of claim 10, further comprising:
    a common test signal input pad configured to provide test input signals to the unit testers;
    a common test pad configured to receive test output signals from the unit testers; and
    a control signal input pad configured to input a control signal for controlling an enabling of the unit testers.

12. The semiconductor device of claim 10, wherein the plurality of dividing units includes:
    a first dividing unit for dividing the clock signal in a first division ratio; and
    a second dividing unit for dividing an output signal of the first dividing unit in a second division ratio, and
    wherein the decoding unit decodes the output signal of the first dividing unit and the output signal of the second dividing unit to output the test control signals.

13. The semiconductor device of claim 12, wherein the decoding unit includes a logic gate for performing an AND operation to the output signal of the first dividing unit and the output signal of the second dividing unit.

* * * * *